(12) United States Patent
Liu et al.

(10) Patent No.: US 9,607,911 B2
(45) Date of Patent: Mar. 28, 2017

(54) OPTICAL PROGRAMMING OF ELECTRONIC DEVICES ON A WAFER

(71) Applicant: FREESCALE SEMICONDUCTOR, INC., Austin, TX (US)

(72) Inventors: Lianjun Liu, Chandler, AZ (US); Philippe Lance, Toulouse (FR); David J. Monk, Mesa, AZ (US); Babak A. Taheri, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 75 days.

(21) Appl. No.: 14/799,171

(22) Filed: Jul. 14, 2015

(65) Prior Publication Data

US 2016/0276231 A1 Sep. 22, 2016

(30) Foreign Application Priority Data

Mar. 16, 2015 (WO) .................. PCT/IB2015/000629

(51) Int. Cl.
*G01R 31/28* (2006.01)
*H01L 21/66* (2006.01)
*G01R 1/073* (2006.01)
*G01R 31/302* (2006.01)

(52) U.S. Cl.
CPC .......... *H01L 22/30* (2013.01); *G01R 1/07342* (2013.01); *G01R 31/2884* (2013.01); *G01R 31/3025* (2013.01); *H01L 22/10* (2013.01); *G01R 31/2891* (2013.01)

(58) Field of Classification Search
CPC ..... H04L 22/30; H04L 22/10; G01R 1/07342; G01R 31/2884
See application file for complete search history.

(56) References Cited

U.S. PATENT DOCUMENTS

| | | | |
|---|---|---|---|
| 6,630,685 B1 | 10/2003 | Lunde | |
| 6,731,122 B2 * | 5/2004 | Feng | G01R 31/311 324/762.03 |
| 6,985,648 B2 * | 1/2006 | Kish, Jr. | B82Y 20/00 385/1 |
| 7,050,666 B2 * | 5/2006 | Welch | B82Y 20/00 385/14 |
| 7,057,518 B2 | 6/2006 | Schmidt | |

(Continued)

OTHER PUBLICATIONS

Extended European Search Report for Patent Appln. No. 16160536.5 (Aug. 24, 2016).

(Continued)

*Primary Examiner* — Esaw Abraham
(74) *Attorney, Agent, or Firm* — Charlene R. Jacobsen

(57) ABSTRACT

A system for programming integrated circuit (IC) dies formed on a wafer includes an optical transmitter that outputs a digital test program as an optical signal. At least one optical sensor (e.g., photodiode) is formed with the IC dies on the wafer. The optical sensor detects and receives the optical signal. A processor formed on the wafer converts the optical signal to the digital test program and the digital test program is stored in memory on the wafer in association with one of the IC dies. The optical transmitter does not physically contact the dies, but can flood an entire surface of the wafer with the optical signal so that all of the IC dies are concurrently programmed with the digital test program.

15 Claims, 5 Drawing Sheets

(56) References Cited

U.S. PATENT DOCUMENTS

| | | | |
|---|---|---|---|
| 7,062,114 B2* | 6/2006 | Webjorn | B82Y 20/00 385/14 |
| 7,262,852 B1* | 8/2007 | Gunn, III | G02B 6/12007 250/559.4 |
| 7,325,180 B2 | 1/2008 | Pileggi et al. | |
| 7,792,396 B2* | 9/2010 | Kish, Jr. | B82Y 20/00 324/762.03 |
| 8,358,147 B2* | 1/2013 | Pagani | G01R 31/3172 324/762.02 |
| 8,606,102 B2* | 12/2013 | Lee | G11C 29/32 398/16 |
| 9,442,159 B2* | 9/2016 | Pagani | G01R 31/3172 |
| 2002/0196029 A1 | 12/2002 | Schmidt | |
| 2003/0221152 A1 | 11/2003 | Volkerink et al. | |
| 2004/0017215 A1* | 1/2004 | Mule | G01R 31/311 324/754.06 |
| 2005/0138499 A1 | 6/2005 | Pileggi et al. | |
| 2006/0235647 A1 | 10/2006 | Nassif | |
| 2008/0211113 A1 | 9/2008 | Chua | |
| 2010/0204566 A1 | 8/2010 | Uchiyama | |
| 2011/0204140 A1 | 8/2011 | Hart | |
| 2011/0234253 A1 | 9/2011 | Bhaskarani | |
| 2013/0021048 A1 | 1/2013 | Peng et al. | |

OTHER PUBLICATIONS

Non Final Office Action, U.S. Appl. No. 14/754,069; 17 pages (Aug. 15, 2016).
Extended European Search report for application No. 16305638.5; 6 pages (Nov. 24, 2016).

* cited by examiner

OPTICAL PROGRAMMING OF ELECTRONIC DEVICES ON A WAFER

TECHNICAL FIELD OF THE INVENTION

The present invention relates generally to integrated circuits. More specifically, the present invention relates to a system and method for optical programming of integrated circuits on a wafer for wafer level testing.

BACKGROUND OF THE INVENTION

Wafer level probing and/or wafer level chip scale package (WLCSP) testing of a complimentary metal-oxide-semiconductor (CMOS) wafer containing a plurality of integrated circuit (IC) dies typically requires communication between the external test equipment (e.g., tester) and the device under test (e.g., an IC die). A primary aspect of the communication is to download a test program from the tester to each IC die on the wafer and then receive the test results to verify if the IC die under test is a good die or a bad die.

IC dies are increasingly being fabricated with a build-in self-test (BIST) mechanism or function. A BIST function or mechanism permits an IC die to verify all or a portion of the internal functionality of the IC die. Inclusion of a BIST can reduce reliance upon and/or the complexity of external test equipment, thereby reducing test costs. For example, with the inclusion of the BIST mechanism at each IC die, a test program downloaded from the tester may simply initiate execution of the BIST, receive the test result (e.g., pass/fail) from the BIST, and communicate that result back to the tester.

Thus, with the inclusion of a BIST mechanism, wafer level testing is becoming faster due to a reduction in communication between the tester and the devices under test. However, wafer level testing typically entails a process of die-by-die programming and testing in which a probe of the tester must index or step between each of the IC dies on the wafer. The process of indexing or stepping between each of the IC dies on the wafer to perform die-by-die programming and testing is still undesirably time consuming and costly. Therefore, a need exists in the art of wafer level testing to increase the speed of testing and thereby decrease the costs associated with testing.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

In overview, embodiments of the present invention entail a system and methodology for programming integrated circuit (IC) dies formed on or in a wafer. The system includes an optical transmitter located at a probe card of a wafer tester and optical sensors, e.g., photodiodes, formed with the IC dies on the wafer. The optical transmitter outputs a test program in the form of an optical signal that is detectable by input devices, e.g., the optical sensors. This optical signal is converted back to the test program and the test program is stored in association with each of the IC dies. By utilizing an optical programming approach, all of the IC dies on the wafer can be programmed concurrently without the need for communication between the tester and each individual IC die. Accordingly, test time and cost can be dramatically reduced. Furthermore, by combining the optical programming approach for download of a test program with built-in self-test (BIST) functionality, wafer level testing/probing of the IC dies can be carried out without indexing or stepping the tester between each of the IC dies on the wafer.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued. It should be further understood that the use of relational terms, if any, such as first and second, top and bottom, and the like are used solely to distinguish one from another entity or action without necessarily requiring or implying any actual such relationship or order between such entities or actions.

Figure 1:
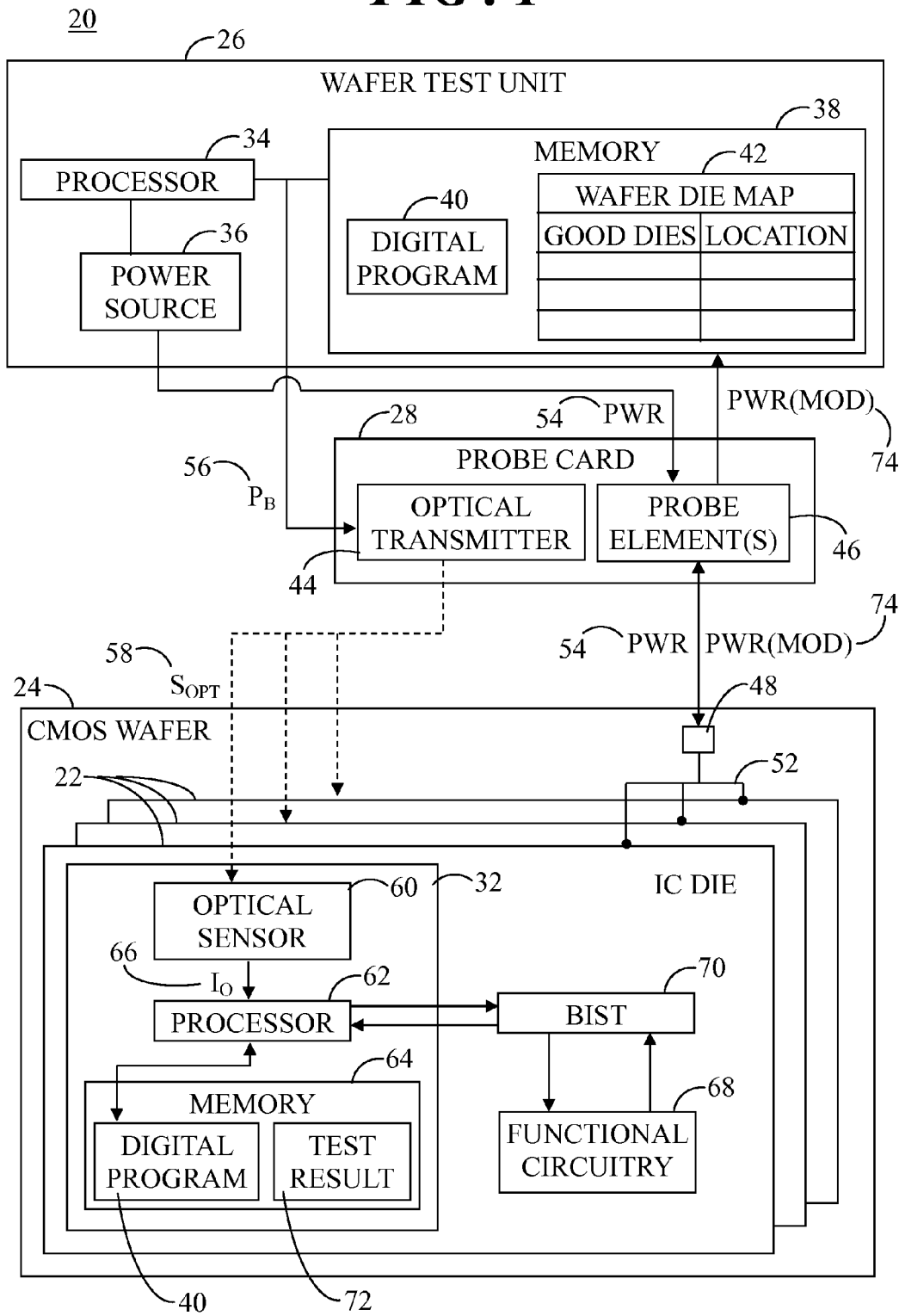
FIG. 1 shows a block diagram of a system for programming and testing integrated circuit (IC) dies formed on or in a wafer in accordance with an embodiment.

Referring now to FIG. 1, FIG. 1 shows a block diagram of a system 20 for remote programming and testing integrated circuit (IC) dies 22 formed on or in a wafer 24 in accordance with an embodiment. IC dies 22 may encompass microprocessors, microcontrollers, static random access memory (RAM), and other digital logic circuits fabricated in accordance with complementary metal-oxide-semiconductor (CMOS) process technology. IC dies 22 may further encompass some analog circuits such as CMOS image sensors, data converters, radiofrequency (RF) transceivers, operational amplifiers, and the like. In accordance with CMOS process technology, the IC dies 22 of wafer 24 use a combination of p-type and n-type metal-oxide-semiconductor field-effect-transistors (MOSFETs) to implement logic gates and other digital circuits.

For simplicity of illustration in the block diagram of FIG. 1, wafer 24 is represented by a rectangle and the multiple IC dies 22 are represented by a series of three rectangles that appear to be stacked one on top of the other. It should be readily apparent to those skilled in the art that IC dies 22 are not formed in a stacked relationship on a rectangular wafer 24. Rather the multiple IC dies 22 of wafer 24 are laterally spaced from one another relative to the plane of wafer 24.

System 20 generally includes a wafer test unit 26 having a probe card 28, and a plurality of subsystems 32 formed on wafer 24. Wafer test unit 26 may be a conventional tester, sometimes referred to as a wafer prober, used to test integrated circuits. Wafer test unit 26 can include one or more processors 34, a power source 36, and a memory element 38. In general, processor 34 may control the operation of probe card 28 and power source 36. Processor 34 may additionally, or alternatively, enable access to and from memory element 38. Those skilled in the art will recognize that wafer test unit 26 can include a variety of functional elements and mechanisms for loading and unloading wafers 24 onto a wafer chuck, pattern recognition optics for suitably aligning wafer 24 on the wafer chuck, and so forth. Details of these additional functional elements and mechanisms will not be explained in any greater extent than that considered necessary for the understanding and appreciation of the underlying concepts of the examples set forth herein and in order not to obscure or distract from the teachings herein.

Memory element 38 may have a digital test program 40 and a wafer die map 42, sometimes referred to as a wafer-map, stored therein. As will be discussed in significantly greater detail below, digital test program 40 is used by system 20 to test IC dies 22 on wafer 24. Information regarding those IC dies 22 that are good, i.e., passing, may be stored in wafer die map 42 along with their locations on wafer 24. Wafer die map 42 may be used to categorize the passing and non-passing IC dies 22 by making use of bins. A bin can then be identified as containing good dies or as containing bad dies. Wafer die map 42 can then be sent to subsequent die handling equipment which only picks up the passing IC dies 22 by selecting the bin number of the good IC dies 22. In other systems, non-passing IC dies 22 may be marked with a small dot of ink in the middle of the dies in lieu of wafer die map 42. When ink dots are used, vision systems on subsequent die handling equipment can disqualify the IC dies 22 by recognizing the ink dot.

System 20 is particularly configured to enable non-contact communication of digital test program 40 from wafer test unit 26 to wafer 24. To that end, an optical transmitter 44 is coupled to probe card 28. However, IC dies 22 must be energized prior to communication of digital test program 40 from wafer test unit 26 to wafer 24. Thus, at least one probe element 46 is additionally coupled to probe card 28. Probe element 46 is configured for touch down on at least one probe pad 48 on wafer 24. Probe pad 48, in turn, may be interconnected with one or more IC dies 22 via electrically conductive traces 52 to provide power to IC dies. As such, source power 54, labeled PWR, can be provided from power source 36 to each of IC dies 22 on wafer 24 via probe element 46, probe pad 48 and conductive traces 52 in order to energize the circuitry of IC dies 22.

After IC dies 22 are energized, subsystems 32 (one each of which is associated with one each of IC dies 22), can be programmed and IC dies 22 may be tested. In an embodiment, processor 34 accesses digital test program 40 from memory element 38 and converts digital test program 40 into a sequence of signals that are representative of digital test program 40. By way of example, digital test program 40 may be converted to its corresponding binary code, in the form of binary digits (e.g., 0's and 1's). This series of binary digits is referred to herein as binary code 56, and is labeled $P_B$ in FIG. 1.

Binary code 56 can be communicated from wafer test unit 36 to optical transmitter 44. Optical transmitter 44 does not physically contact IC dies 22 of wafer 24. Instead, optical transmitter 44 can include one or more optical sources that generate and output light, for example, visible or infrared light. This light is referred to herein as an optical signal 58, labeled $S_{OPT}$, corresponding to binary code 56. Optical signal 58 is emitted from optical transmitter 44 over a relatively short distance as a change in the light being emitted from optical transmitter 44. When optical transmitter 44 includes more than one optical source, optical signal 58 may be output from the multiple optical sources, in a serial or parallel manner, to collectively flood the entire wafer 24.

Accordingly, optical signal 58 is represented by a series of dashed lines to indicate its communication to wafer 24 via non-physical contact. Again by way of example, the output light (i.e., optical signal 58) may include two magnitudes, where one magnitude corresponds to a "0" in binary code 56 and another magnitude corresponds to a "1" in binary code 56. In an example embodiment, optical transmitter 44 can modulate binary code 56 as a sequence of pulses of light (e.g., ON and OFF pulses). It should be understood however, that digital test program 40 may be converted into any suitable code that is thereafter output from optical transmitter 44 as optical signal 58.

Each of subsystems 32 includes an optical sensor 60 formed with its associated IC die 22, a processor 62 in communication with optical sensor 60, and a memory element 64 in communication with processor 62. Optical sensor 60 is adapted to detect and receive optical signal 58. In operation, optical sensor 60 can sense, for example, the sequence of pulses of light (e.g., ON and OFF pulses). Optical sensor 60 may be, for example, a semiconductor diode such as a photodiode that converts the detected light, e.g., optical signal 58, into current. In alternative embodiments, optical sensor 60 may be any of a variety of suitable photosensors or photodetectors configured to sense light (e.g., visible, infrared, ultraviolet, X-rays, gamma rays, and the like) or other electromagnetic energy that is emitted from optical transmitter 44.

Optical sensor 60 can be a semiconductor device that is readily fabricated in accordance with the process flow for constructing IC dies 22. However, optical sensor 60 typically must be exposed to allow optical signal 58 to reach optical sensor 60. Therefore, in some embodiments, optical sensor 60 may be fabricated on the surface of wafer 24. Alternatively, optical sensor 60 may be embedded within wafer 24 with a window, optical fiber connection, or other structure formed therein to allow optical signal 58 to reach the sensitive part of optical sensor 60.

Optical sensor 60 can decode the sensed optical signal 58 and communicate optical signal 58 as an output current 66, labeled $I_O$, to processor 62. In an embodiment, output current 66 corresponds with binary code 56. As such, processor 62 can convert or otherwise determine digital test program 40 from output current 66. Accordingly, processor 62, in cooperation with optical sensor 60, is adapted to convert optical signal 58 to digital test program 40. Thereafter, processor 62 communicates digital test program 40 to memory element 64, where digital test program 40 is stored.

In accordance with a particular embodiment, optical transmitter 44 is configured to flood an entire surface of wafer 24 with optical signal 58. Thus, each of subsystems 32 concurrently receives optical signal 58, converts optical signal 58 to digital test program 40, and stores digital test program 40 in memory element 64 of its corresponding IC die 22. Consequently, digital test program 40 can be loaded to all of IC dies 22 on wafer 24 in parallel via a remote optical programming approach with optical sensors 60 being the receiving elements without the need for physical communication from wafer test unit 26 on a die-by-die basis to each individual IC die 22.

Each of IC dies 22 includes functional circuitry 68. Additionally, each of IC dies 22 may include a built-in self-test (BIST) mechanism 70, or BIST processor. BIST mechanism 70 permits each of IC dies 22 to test itself in order to determine the functionality of its associated IC die. By way of example, BIST mechanism 70 functions to verify all or a portion of the internal functionality of its corresponding IC die 22 and produce a test result 72 of that functionality. Thus, BIST mechanism 70 can be implemented to perform faster, less-expensive integrated circuit testing.

In a wafer level testing scenario, processor 62 functions as a BIST controller and digital test program 40 includes a minimal set of instructions for initiating execution of BIST mechanism 70, receiving and storing test result 72 in memory element 64, and thereafter communicating test result 72 to wafer test unit 26. In an embodiment discussed below, processor 62 may modulate source power 54 in accordance with test result 72 to produce modulated source power 74, labeled PWR(MOD). Modulated source power 74 containing test result 72 can then be returned to wafer test unit 26 via probe element 46.

In one example, test result 72 may be a simple PASS or FAIL result. In an embodiment, modulated source power 74 may be produced by modulating the voltage of source power 54 provided to IC dies 22. For example, the voltage may be modulated to produce one voltage magnitude for a PASS result and a different voltage magnitude for a FAIL result. In another embodiment, processor 62 may modulate the current of source power 54 in accordance with test result 72 to produce a modulated source power 74. By way of example, the current may be modulated to produce higher current (e.g., higher power) for a PASS result and a lower current (e.g., lower power) for a FAIL result. Modulated source power 74 containing test result 72 can then be return to wafer test unit 26 via probe element 46.

Accordingly, execution of each digital test program 40, loaded to all of IC dies 22 on wafer 24 in parallel via a remote optical programming approach, controls operation of BIST mechanism 70 on each IC die 22. Therefore, all IC dies 22 on wafer 24 can be tested and probed without the need for wafer test unit 26 to program each IC die 22 with digital test program 40 individually in series, without executing BIST mechanism 70 of each IC die 22 individually in series, and without requiring physical die-by-die indexing of probe element 46 to receive test result 72. Thus, each of IC dies 22 may be tested in parallel which can significantly reduce test time for an entire wafer 24 and therefore significantly reduce test costs.

Figure 2:
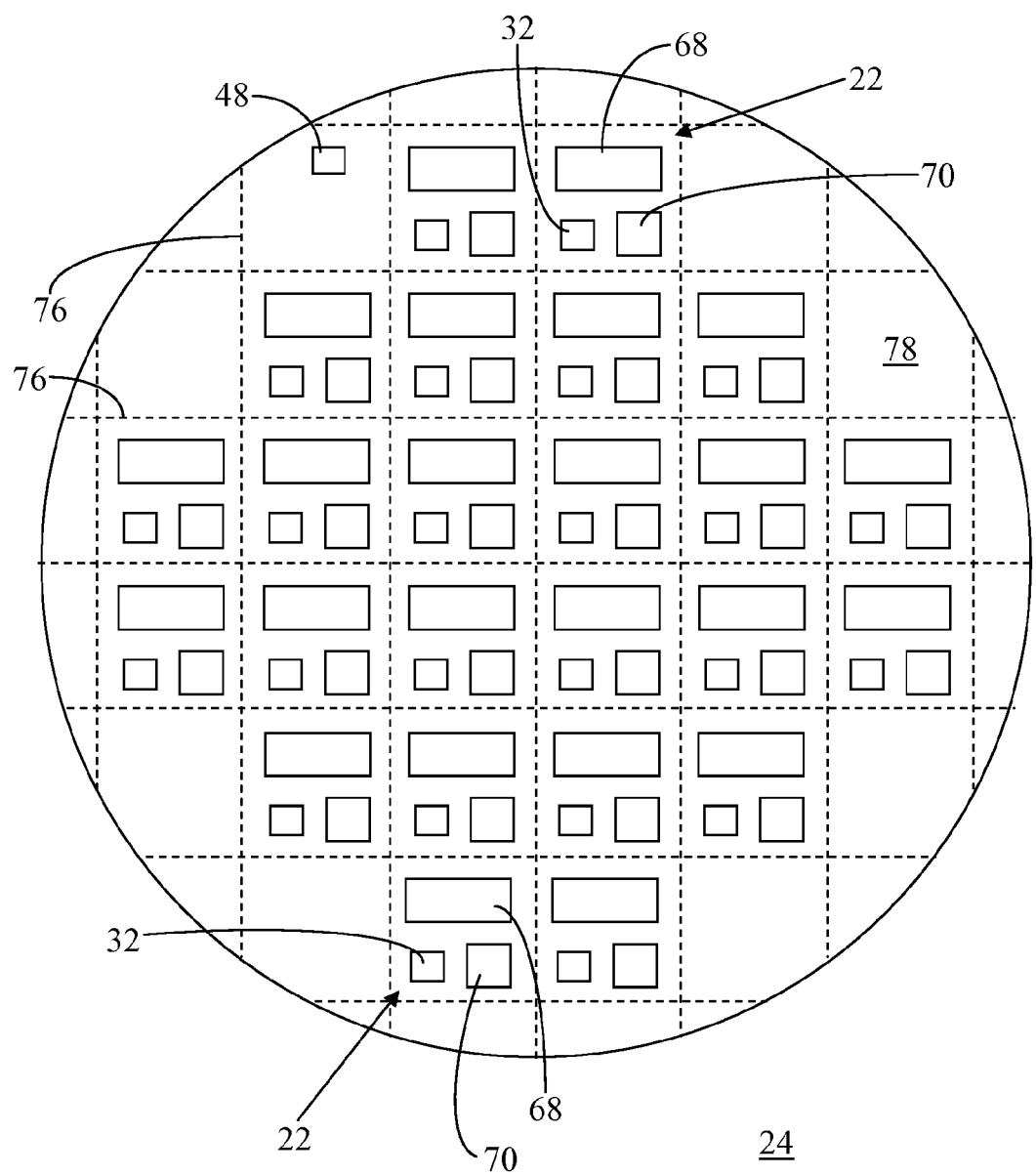
FIG. 2 shows a simplified top view of the wafer of FIG. 1.

FIG. 2 shows a simplified top view of wafer 24 of FIG. 1 on or in which IC dies 22 are formed. Each of IC dies 22 can include functional circuitry 68, BIST mechanism 70, and subsystem 32. Additionally, wafer 24 can include probe pad 48 located in an unused portion of wafer 24, such as at an outer periphery of wafer 24. Conductive traces 52, as well as other unspecified interconnections, are not shown for simplicity. Wafer 24 includes only a few IC dies 22 for simplicity of illustration. Those skilled in the art will recognize that a single wafer can include hundreds, thousands, or even tens of thousands of individual IC dies 22.

IC dies 22 are separated by scribe lines 76 formed in a surface 78 of wafer 24. A first set of scribe lines 76 may extend parallel to one another in one direction, i.e., horizontally across a surface 78 of wafer 24. Another set of scribe lines 76 may extend substantially parallel to one another across surface 78 of wafer 24 in a different direction or substantially orthogonal to the first set of scribe lines 76. Scribe lines 76 may form substantially square or rectangular areas, each of which define IC die 22 or semiconductor chip. Scribe lines 76 can be used to separate each of IC dies 22 after fabrication. In an example, each subsystem 32 is located within an area circumscribed by scribe lines 76. However, scribe lines 76 may have a predetermined width that permits subsystems 32 and/or conductive traces 52 (shown in FIG. 1) to be located within scribe lines 76. Thus, IC dies 22 may be tested at wafer level, i.e., prior to dicing, during the manufacturing process.

Each subsystem 32 is located within an area circumscribed by scribe lines 76 to emphasize that each IC die 22 may have an optical sensor 60, processor 62, and memory element 64 (FIG. 1) associated with it. It should be understood that various alternative subsystem configurations may be envisioned. For example, one optical sensor 60 may be associated with more than one IC die 22 but less than all of the IC dies 22 on wafer 24 and communicate its output via conductive lines (not shown) to a plurality subsystems associated with the subset of IC dies 22, where each of the subsystems includes one of processors 62 and memory elements 64. Furthermore, a single probe pad 48 is shown for simplicity of illustration. However, wafer 24 can include multiple probe pads 48, each of which can communicate source power 54 (FIG. 1) to a subset of IC dies 22.

Figure 3:
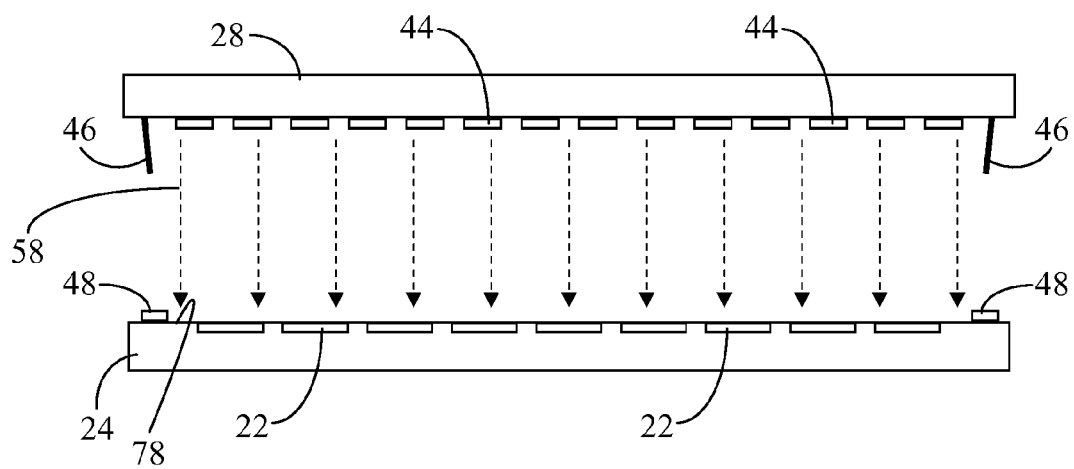
FIG. 3 shows a simplified side view of a probe card of the system and a wafer under test.

FIG. 3 shows a simplified side view of probe card 28 of system 20 (FIG. 1) and wafer 24 under test. More particularly, probe card 28 is shown with optical transmitter 44, e.g., one or more light sources, for outputting optical signal 58, and two probe elements 46. Wafer 24 is shown with a number of IC dies 22 formed therein, where each IC die 22 includes functional circuitry 68 (FIG. 1), BIST mechanism 70 (FIG. 1), and one of subsystems 32 (FIG. 1) that includes optical sensor 60 (FIG. 1) for receiving optical signal 58.

Probe elements 46 may touch down onto probe pads 48 formed on wafer 24 to provide source power 54 (FIG. 1). However, optical transmitter 44 does not physically contact IC dies 22 or wafer 24. Rather, optical transmitter 44 floods the entire surface 78 of wafer 24 with optical signal 58 to enable parallel programming of all of IC dies 22 on wafer 24 via a remote optical programming approach.

Figure 4:
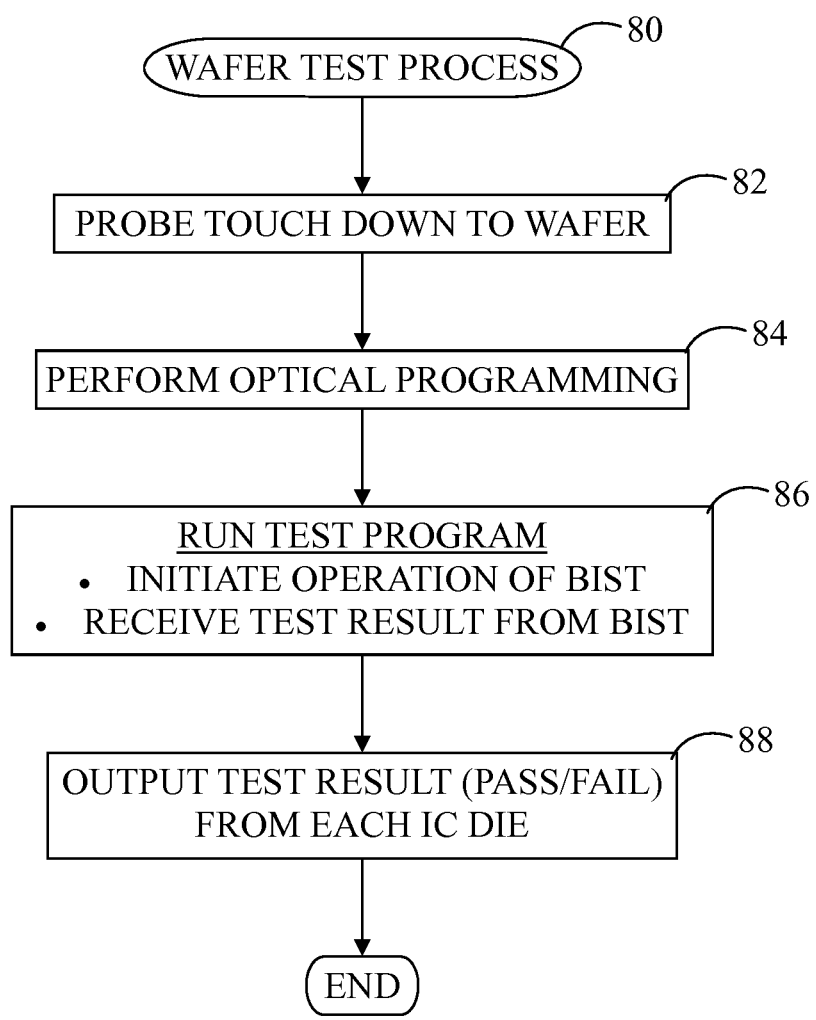
FIG. 4 shows a flowchart of a wafer test process.

Now referring to FIG. 4 in conjunction with FIG. 1, FIG. 4 shows a flowchart of a wafer test process 80 that may be performed utilizing system 20 during, for example, wafer manufacturing. Wafer test process 80 provides a generalized description of the operations for implementing a contactless optical programming approach to concurrently program all of IC dies 22 on wafer 24. Furthermore, wafer test process 80 combines the optical programming approach for download of a test program with built-in self-test (BIST) mechanism 70 within each of IC dies 22 in order to perform wafer level testing/probing of IC dies 22 without indexing or stepping wafer test unit 26 between each of IC dies 22 on wafer 24.

At a block 82 of wafer test process 80, touchdown of probe element(s) 46 to probe pad(s) 48 of wafer 24 is performed in order to supply source power 54 to wafer 24. Wafer test process 80 continues at a block 84. At block 84, remote optical programming is performed to concurrently program all of IC dies 22 on wafer 24. Optical programming is discussed hereinafter in connection with FIG. 5. At a block 86, the test program, i.e., digital test program 40, is run at each of IC dies 22. Execution of digital test program 40 initiates execution of BIST mechanism 70 and enables receipt at processor 62 of test result 72.

At a block 88, test result 72, e.g., PASS or FAIL, for each IC die 22 is output from its associated subsystem 32. In one example, each of IC dies 22 may be successively enabled to modulate source power 54 to produce modulated source power 74, where the specific modulation pattern indicates PASS or FAIL. Modulated source power 74 can be communicated from wafer 24 to wafer test unit 26. The PASS/FAIL state of each IC die 22 may subsequently be recorded in wafer die map 42. Following block 88, wafer level testing is complete and wafer test process 80 ends.

Figure 5:
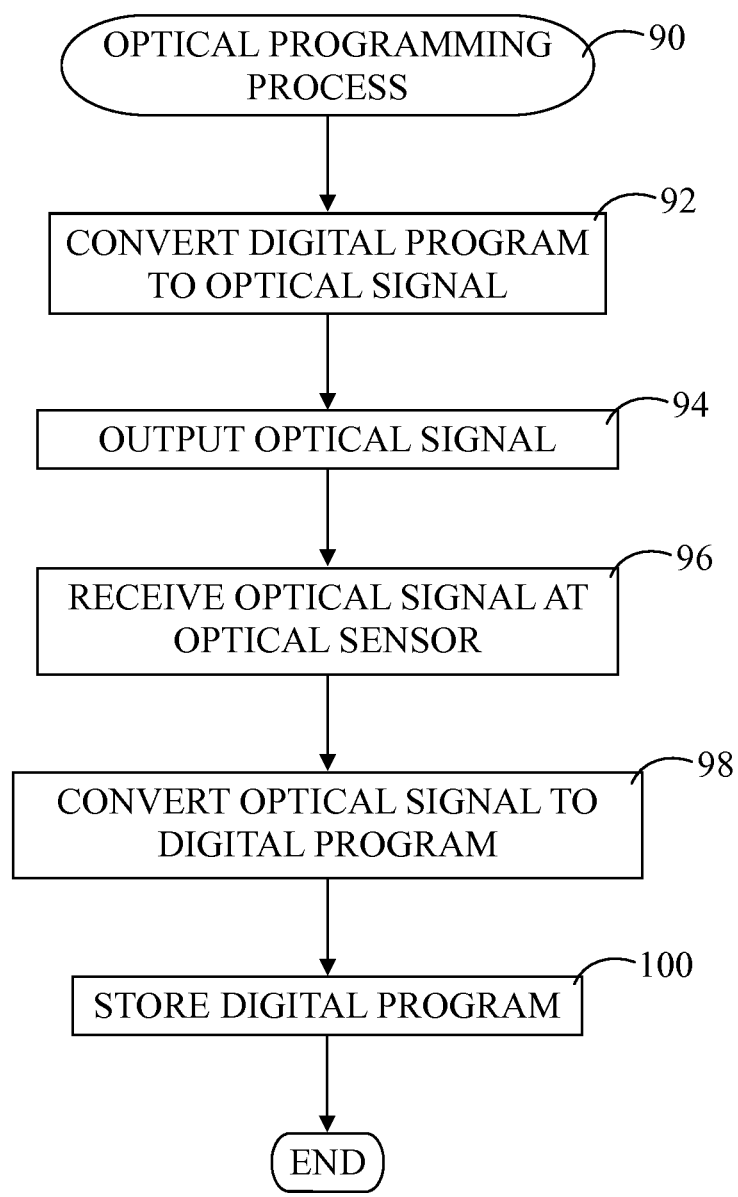
FIG. 5 shows a flowchart of a magnetic programming process executed in connection with the wafer test process.

Referring now to FIGS. 1 and 5, FIG. 5 shows a flowchart of an optical programming process 90 executed in connection with wafer test process 80 (FIG. 4). More particularly, optical programming process 90 is performed to concurrently program all IC dies 22 on wafer 24 at block 84 of process 80 in accordance with a particular embodiment of the invention.

At a block 92 of optical programming process 90, processor 34 and optical transmitter 44 suitably convert digital test program 40 to optical signal 58, as discussed above. At a block 94, optical transmitter 44 outputs optical signal 58. Again, optical signal 58 may be sequence of pulses of light (e.g., ON and OFF pulses), or any other variable light sequence corresponding to digital test program 40.

In response to the transmission of optical signal 58 at block 94, optical signal 58 is detected by (i.e., received at) each of optical sensors 60 formed in wafer 24 at a block 96. At a block 98, processors 62 in wafer 24 convert the received optical signal 58 to digital test program 40. Thereafter, digital test program 40 is stored in memory element 64 of each subsystem 32 on wafer 24 at a block 100 and optical programming process 90 ends. Thus, the outcome of optical programming process 90 is to concurrently download digital test program 40 to all IC dies 22 on wafer 24 that were identified as being "good" (i.e., not having a short circuit). This downloaded and stored digital test program 40 is stored for later execution in accordance with wafer test process 80 (FIG. 4).

It is to be understood that certain ones of the process blocks depicted in FIGS. 4 and 5 may be performed in parallel with each other or with performing other processes. In addition, it is to be understood that the particular ordering of the process blocks depicted in FIGS. 4 and 5 may be modified, while achieving substantially the same result. Accordingly, such modifications are intended to be included within the scope of the inventive subject matter.

Thus, a system and a method for programming IC dies formed on a wafer have been described. An embodiment of a system for programming IC dies formed on a wafer comprises an optical transmitter configured to output a digital program as an optical signal and an optical sensor formed with the IC dies of the wafer, the optical sensor being configured to receive the optical signal from the optical transmitter. The system further comprises a processor formed on the wafer and in communication with optical sensor, the processor being adapted to convert the optical signal to the digital program, and a memory element associated with one of the IC dies on the wafer, the memory element being adapted to store the digital program.

An embodiment of a method of programming IC dies formed on a wafer comprises transmitting a digital program as an optical signal from an optical transmitter and receiving the optical signal from the optical transmitter at an optical sensor formed with the IC dies of the wafer. The method further comprises converting the optical signal to the digital program at a processor formed on the wafer and in communication with the optical sensor and storing the digital program in a memory element associated with one of the IC dies on the wafer.

The systems and processes, discussed above, and the inventive principles thereof provide a remote optical programming approach to concurrently program all of the IC dies on the a wafer without the need for separate communication between the test unit and each individual IC die. Accordingly, test time and cost can be dramatically reduced. Furthermore, by combining the optical programming approach for download of a test program with built-in self-test (BIST) functionality, wafer level testing/probing of the IC dies can be carried out without indexing or stepping the tester between each of the IC dies on the wafer in order to further reduce test time and test cost.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system for programming integrated circuit (IC) dies formed on a wafer comprising:
    an optical transmitter configured to output a digital program as an optical signal;
    an optical sensor formed with said IC dies of said wafer, said optical sensor being configured to receive said optical signal from said optical transmitter;
    a processor formed on said wafer and in communication with said optical sensor, said processor being adapted to convert said optical signal to said digital program; and
    a memory element associated with one of said IC dies on said wafer, said memory element being adapted to store said digital program, wherein said one of said IC dies includes a built-in self-test (BIST) mechanism to determine a functionality of said one of said IC dies, said processor is configured to communicate with said BIST mechanism, said processor is further configured to execute said digital program and receive a test result indicative of said functionality of said one of said IC dies, and wherein execution of said digital program initiates operation of said BIST mechanism and receipt of said test result from said BIST mechanism.

2. The system of claim 1 wherein said optical transmitter does not physically contact said wafer.

3. The system of claim 1 wherein said optical transmitter is adapted to modulate said digital program as a sequence of optical pulses, said sequence of optical pulses forming said optical signal.

4. The system of claim 1 wherein said optical transmitter includes at least one optical source configured to flood an entire surface of said wafer with said optical signal.

5. The system of claim 1 wherein said optical transmitter outputs said optical signal as visible light.

6. The system of claim 1 wherein said optical transmitter outputs said optical signal as infrared light.

7. The system of claim 1 wherein said optical sensor comprises a semiconductor diode.

8. The system of claim 7 wherein said semiconductor diode comprises a photodiode.

9. The system of claim 1 wherein optical sensor is one of a plurality of optical sensors, one each of said optical sensors being formed with one each of said IC dies of said wafer.

10. The system of claim 1 wherein said processor is one of a plurality of processors, one each of said processors being formed with one each of said IC dies of said wafer, and said each of said processors is adapted to receive and convert said optical signal to said digital program.

11. The system of claim 1 wherein said memory element is one of a plurality of memory elements, one each of said memory elements being formed with one each of said IC dies of said wafer, and said each of said memory elements is adapted to store said digital program.

12. A system for programming integrated circuit (IC) dies formed on a wafer comprising:
- an optical transmitter configured to output a digital program as an optical signal;
- an optical sensor formed with said IC dies of said wafer, said optical sensor being configured to receive said optical signal from said optical transmitter;
- a processor formed on said wafer and in communication with said optical sensor, said processor being adapted to convert said optical signal to said digital program;
- a memory element associated with one of said IC dies on said wafer, said memory element being adapted to store said digital program;
- a wafer test unit having a probe card, said optical transmitter and a probe element being coupled to said probe card, wherein said probe element provides source power; and
- a probe pad on said wafer and electrically coupled with said IC dies, said probe element being configured for touchdown on said probe pad to selectively provide said source power to each of said IC dies.

13. The system of claim 12 wherein said processor is further configured to execute said digital program, receive a test result indicative of a functionality of said one of said IC dies, and modulate said source power in accordance with said test result to return said test result to said wafer test unit.

14. A method of programming integrated circuit (IC) dies formed on a wafer comprising:
- transmitting a digital program as an optical signal from an optical transmitter;
- receiving said optical signal from said optical transmitter at an optical sensor formed with said IC dies of said wafer;
- converting said optical signal to said digital program at a processor formed on said wafer and in communication with said optical transmitter; and
- storing said digital program in a memory element associated with one of said IC dies on said wafer, wherein said one of said IC dies includes a built-in self-test (BIST) mechanism to determine a functionality of said one of said IC dies, said processor is configured to communicate with said BIST mechanism, said processor is further configured to execute said digital program and receive a test result indicative of said functionality of said one of said IC dies, and wherein execution of said digital program initiates operation of said BIST mechanism and receipt of said test result from said BIST mechanism.

15. The method of claim 14 further comprising:
- fabricating said wafer to include a plurality of subsystems, one each of said subsystems being formed with one each of said IC dies of said wafer, each of said subsystems comprising said optical sensor, said processor in communication with said optical sensor, and said memory element in communication with said processor; and
- flooding an entire surface of said wafer with said optical signal such that each of said subsystems concurrently receives said optical signal, converts said optical signal to said digital program, and stores said digital program in association with said one each of said IC dies.

* * * * *